US009919871B2

(12) United States Patent
Rebstock

(10) Patent No.: US 9,919,871 B2
(45) Date of Patent: Mar. 20, 2018

(54) BUFFER STATION FOR STOCKER SYSTEM

(71) Applicant: DYNAMIC MICRO SYSTEMS, Radolfzell (DE)

(72) Inventor: Lutz Rebstock, Gaienhofen (DE)

(73) Assignee: Brooks Automation (Germany) GmbH (DE)

( * ) Notice: Subject to any disclaimer, the term of this patent is extended or adjusted under 35 U.S.C. 154(b) by 540 days.

(21) Appl. No.: 14/497,324

(22) Filed: Sep. 26, 2014

(65) Prior Publication Data

US 2015/0012128 A1 Jan. 8, 2015

Related U.S. Application Data

(63) Continuation of application No. 11/881,091, filed on Jul. 25, 2007, now Pat. No. 7,751,919, and a continuation of application No. 11/881,093, filed on Jul. 25, 2007, now Pat. No. 8,868,229.

(51) Int. Cl.
*G06F 7/00* (2006.01)
*B65G 1/137* (2006.01)
*H01L 21/677* (2006.01)
*B65G 1/12* (2006.01)

(52) U.S. Cl.
CPC ............ *B65G 1/1371* (2013.01); *B65G 1/12* (2013.01); *H01L 21/67769* (2013.01)

(58) Field of Classification Search
None
See application file for complete search history.

(56) References Cited

U.S. PATENT DOCUMENTS

| | | | |
|---|---|---|---|
| 3,845,286 A | 10/1974 | Aronstein et al. | |
| 4,870,592 A | 9/1989 | Lampi et al. | |
| 5,216,613 A | 6/1993 | Head, III | |
| 5,446,669 A | 8/1995 | Yamashita et al. | |
| 6,890,862 B2 | 5/2005 | Wagner et al. | |
| 7,751,919 B2 | 7/2010 | Rebstock | |
| 2002/0094257 A1* | 7/2002 | Babbs | B65G 1/045 414/277 |
| 2002/0095223 A1 | 7/2002 | Chang et al. | |
| 2004/0153868 A1* | 8/2004 | Nonaka | G05B 19/41805 714/47.2 |
| 2004/0234360 A1 | 11/2004 | Hayashi | |
| 2006/0039781 A1 | 2/2006 | Niewmierzycki et al. | |
| 2006/0045665 A1 | 3/2006 | Hall et al. | |
| 2006/0154385 A1 | 7/2006 | Aggarwal | |
| 2006/0263177 A1 | 11/2006 | Meulen | |
| 2007/0043464 A1 | 2/2007 | Zief | |
| 2007/0264106 A1 | 11/2007 | Van Der Meulen | |

(Continued)

*Primary Examiner* — Yolanda R Cumbess
(74) *Attorney, Agent, or Firm* — Perman & Green, LLP; Colin C. Durham

(57) ABSTRACT

A buffer station provides potential improvement for the operation of a facility. By storing to-be accessed workpieces in the buffer stations of an equipment, the operation of the facility is not interrupted when the equipment is down. The workpieces can be retrieved through emergency access port of the buffer station, thus ensure the continuous supply of workpieces for the workpiece flow of the facility. Algorithm for getting the needed workpieces to the buffer station is also provided through a controller or a computer mechanism. The buffer station can be incorporated in a stocker, such as wafer stocker or reticle stocker.

20 Claims, 4 Drawing Sheets

(56) References Cited

U.S. PATENT DOCUMENTS

| | | |
|---|---|---|
| 2007/0269297 A1 | 11/2007 | Meulen et al. |
| 2008/0080963 A1 | 4/2008 | Bufano et al. |
| 2008/0085173 A1 | 4/2008 | Van der Meulen |
| 2008/0086237 A1 | 4/2008 | Rebstock |
| 2008/0091301 A1 | 4/2008 | Brantmark et al. |
| 2008/0163096 A1 | 7/2008 | Pannese et al. |
| 2008/0304944 A1* | 12/2008 | Sung ............... H01L 21/67017 414/217.1 |

* cited by examiner

BUFFER STATION FOR STOCKER SYSTEM

This patent application is a continuation and claims priority from

U.S. utility patent application Ser. No. 11/881,093, filed on Jul. 25, 2007, entitled "Buffer station for stocker system", which is incorporated herein by reference.

FIELD OF THE INVENTION

The present invention relates to semiconductor equipment, and more particularly, to equipment and method to improve fabrication facility processing.

BACKGROUND

Stockers generally are installed within, a semiconductor facility for temporarily storing workpieces, such as wafers, flat panel displays, LCD, photo lithography reticles, or masks.

In the process of manufacturing semiconductor devices, LCD panels, and others, there are hundreds of processing equipment and thus hundreds of manufacturing steps. It is very difficult for the flow of the wafers, flat panels, or LCDs (hereinafter "workpieces") to be uniform, from step to step and/or from tool to tool. Despite the best planners, there is always the unexpected-scenario, such as a tool down, an emergency lot coming through, a periodic maintenance lasting longer than planned, thus there are various accumulations of the workpieces at certain steps for certain tools, The accumulated workpieces will need to be stored in a storage stocker, waiting to be processed.

Further, photolithography process is a critical process in the semiconductor fabrication facility, involving a large number of photolithography masks or reticles (hereinafter "reticles"). The reticles thus are typically stored in a storage stocker, and retrieved when needed into the lithography exposure equipment.

The storage of workpieces and reticles (hereafter "articles") is much more complicated due to the requirement of cleanliness. Damages to the articles can be physical damages in the form of particles, or chemical damages in the form of interactions. With the critical dimension of the semiconductor device processing surpassing 0.1 micron, particles of 0.1 micron size and reactive species will need to be prevented from approaching the articles. The storage chamber typically would need to be even cleaner than the processing facility, to ensure less cleaning between processing.

Thus the stocker storage chamber is typically designed to be sealed off from the outside environment, preferably with constant purging, and even with inert gas flow to prevent possible chemical reactions. Access to the storage chamber is load-locked, to ensure isolation between the clean storage environment and the outside environment.

This creates a potential problem in the event of the failure of the stocker, such as a transport malfunction, or a load lock malfunction, the stocker storage becomes isolated, with no way to retrieve articles from the stocker storage. This failure, through a chain reaction, could shut down a large portion of the fabrication facility.

SUMMARY

Methods and apparatuses for improving the operation of a facility are disclosed. In exemplary embodiments, the operation improvement of a facility is achieved through a plurality of buffer stations. A buffer station can be an interfacial station between a storage chamber and an IC station with an emergency access port. Typical workpiece retrieval comprises moving the workpiece from the chamber to the buffer station and then to the IC station where the workpiece can be taken out to another equipment. Typical workpiece storage (or other operation) comprises moving the workpiece from the IC station to the storage chamber, bypassing the buffer station. Alternatively, the workpiece can move from the IC station to the buffer station before being transferred to the storage chamber.

In an exemplary embodiment, the buffer station stores the needed workpiece. Thus when recalled, the workpiece will be brought directly from the buffer station to the IC station, instead of from the storage chamber. For example, if workpiece A is anticipated to be needed, it will be brought to the buffer station. And when needed, the workpiece can be retrieved from the buffer station.

In exemplary embodiments, the invention further comprises an algorithm or a controller for determining the sequence of the workpiece flow, for example, to anticipate or to know the workpieces to be brought to the buffer station. In a facility, such as a semiconductor fabrication facility, the workpiece flow can be imported to the controller as an input.

In an exemplary embodiment, the buffer station comprises an emergency access port. The emergency access port can allow accessing the workpiece when the equipment fails, for example, when the robotic mechanism is not operational to bring the workpiece to the IC station. Accessing the workpieces from the buffer station through the emergency access port allows the facility to continue to operate even in the event of the equipment failure. Since the buffer station stores the workpieces to be needed in the sequence flow, the operation of the facility is not interrupted.

In exemplary embodiments, the buffer station is designed to store the workpieces for the average time needed to repair the equipment, or a predetermined period such as 24 hours. The emergency access can be performed by an operator or emergency equipment. Load lock or interface with the emergency access port can be provided to prevent workpiece contamination, for example, by exposure to the outside environment.

In an exemplary embodiment, the buffer station can be arranged in a linear XY two dimensional array facing the clean room environment, and which is served as an interface for a stocker, such as a wafer stocker or a reticle stocker.

DETAILED DESCRIPTION OF THE INVENTION

Figure 1:
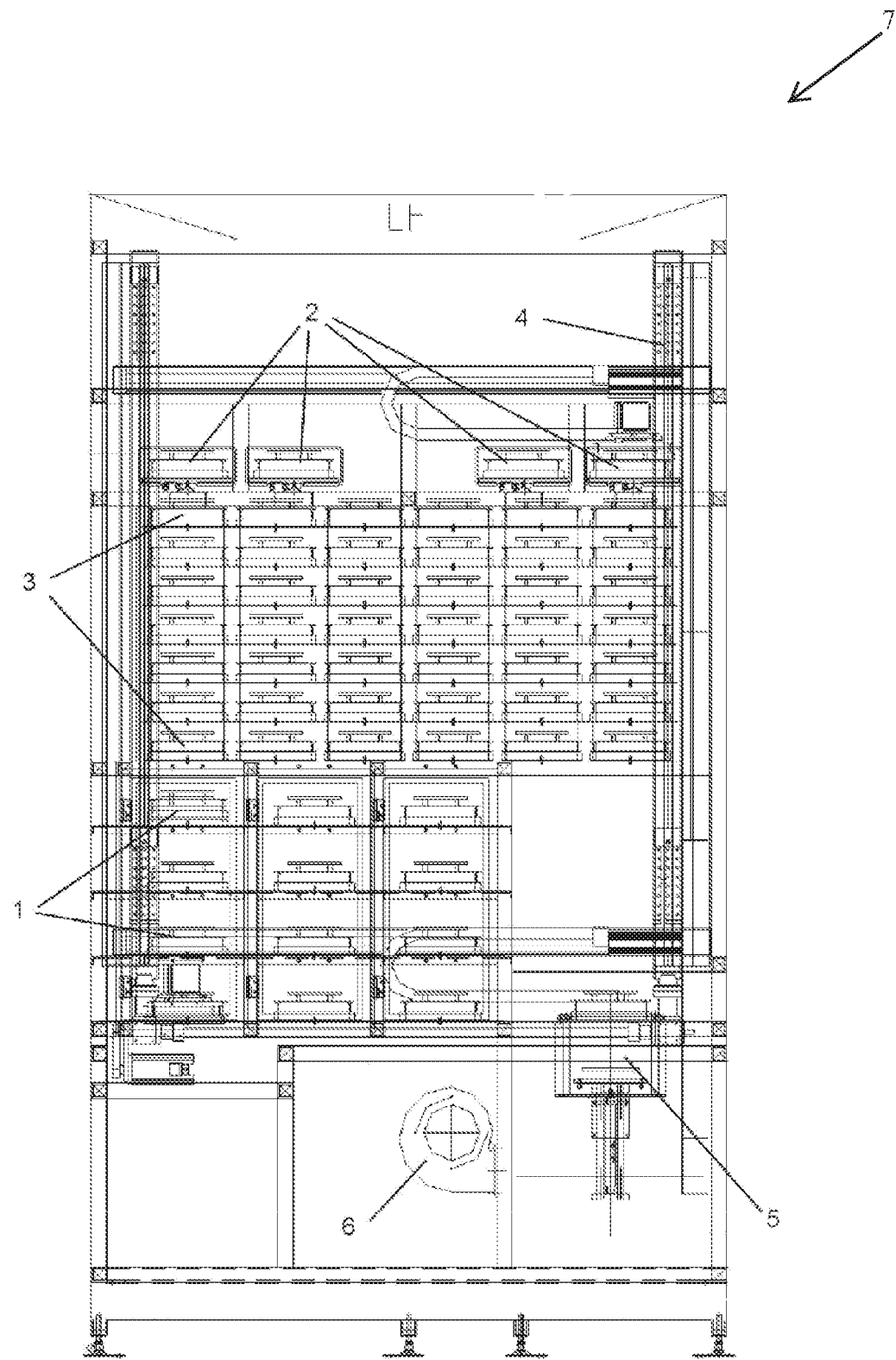
FIG. 1 shows a front view of an embodiment of a reticle stocker, utilizing buffer stations.

The present invention, in general, pertains to methods and apparatuses for a storage stocker system with stocker management for a fabrication facility. According to one embodiment, a buffer station 3 for emergency retrieval is provided. The present invention buffer station 3 provides a retrieval mechanism in the event of the failure of the equipment, such as a reticle storage stocker. The buffer station 3 is preferably associated with a stocker 7, such as a reticle stocker, to provide articles out of the stocker 7 in the event of the failure of the stocker 7. According to another embodiment, an input/output (IC) buffer station for increasing throughput is provided. The IC buffer station is preferably associated with a stocker 7, such as a reticle stocker, to facilitate the transfer of the articles in and out of the stocker 7. According to still another embodiment, stocker management, methodology and apparatus for the buffer station 3 and the IC buffer station are provided.

Cost of ownership is probably one of the most important features in a fabrication equipment and process. Low cost of ownership enables the products to be produced at a low expense, resulting in either high profit margin or high volume sale. Cost of ownership improvements includes the ability to support the flow of the fabrication facility, even in the event of the equipment failure, and the reduction of waiting time, especially for operators.

In one aspect, the present invention discloses a management methodology and apparatuses to a fabrication equipment so that in the event of the failure of that particular fabrication equipment, it still can support the operation of the fabrication facility while waiting for repair.

In one embodiment, the present Invention discloses a buffer station 3 for emergency retrieval. The buffer station 3 comprises an emergency access to allow the retrieval of the articles even when there is a general failure. The emergency access can be an emergency door, preferably at the front side, or an equipment access that is not normally used, such as, an access used by a robot handling in the normal operation. The emergency access can be handled by an operator, or by external handling equipment. The external handling equipment is preferably independent to be able to operate even with a general failure.

The buffer station 3 is generally designed for robotic access, and thus can be very compact with minimum spare volume. The buffer station 3 can be much smaller than an IO station 1, which is designed for operator handling or automatic transfer handling such as an Overhead Transfer system (OHT). Since manual access occurs only in emergency, ergonometric or operator comfort issues can be relaxed, and therefore the buffer station can achieve a minimum volume, resulting in low equipment footprint.

The buffer station 3 is designed for emergency transfer to process equipment, thus should be designed with contamination concerns accordingly. Thus in general, the buffer station 3 is treated like an IO station 1 with respect to the issue of transportation. For example, the articles stored in the buffer station 3 are preferably stored in a form that can be handled or transported in a clean room environment, as in the case of the articles stored in the IO station 1. Thus the articles are preferably stored in carrier boxes, so that there is no contamination or damage to the articles during the transfer to the needed tools. The carrier boxes can be designed for operator handling, or for OHT handling.

The buffer station 3 preferably stores the articles needed next, and more preferably stores an adequate number of articles for a predetermined period so that the operation of the fabrication facility is not stopped or inconvenienced during a general failure. The buffer station 3 can comprise individual compartments, to store carrier boxes. The carrier boxes can contain a single article, or a plurality of articles, to be transported.

The buffer station 3 can be generally associated with IO station 1 so that in the normal course of process fabrication flow, the buffer station 3 can provide articles to the IO station 1 to be transferred to the process equipment needing the articles. In certain situations, the buffer station 3 can be considered as an extension of the IO station 1, to increase the number of IO stations 1 to reduce waiting time. The buffer station 3 can be much smaller than the IO station 1, thus a combination of buffer stations 3 and IO stations 1 can provide a larger number of IO ports for a smaller volume. The buffer station 3 and the IO station 1 can have the same robotic handling system. The IO station 1 can also be associated with either an operator handling or an OHT handling system. For acting as an extension to the IO station 1, the buffer station 3 might not need the emergency access.

The buffer station 3 can be disposed side by side with the IO station 1, with the same access robotic handler 4. The buffer station 3 can be 2-dimensional shelves, for example a 6×7 array of shelves to store articles in their carrier box. The dimension of the buffer station 3 depends on the flow of the facility, the number of articles needed in a predetermined period, and the needed time to repair the equipment. The IO station 1 can also be 2-dimensional shelves, for example a 3×4 array of shelves. The IO station 1 generally require doors, and sometimes even acting as a load lock, for isolating the inside of the equipment to the outside environment. The IO station 1 can also be a one dimensional shelf, for example a linear line of 4 IO stations 2, typically on top of the equipment for overhead transfer system (OHT), The buffer station 3 can be associated with process equipment, or a stocker 7, such as a workpiece stocker or a reticle stocker, to provide articles out of the stocker in the event of the failure of the stocker 7. The buffer station 3 preferably stores the articles needed next, and more preferably stores an adequate number of articles for a predetermined period during which the stocker 7 can be repaired. With the buffer station 3 storing the articles needed for the next period, for example 24 hours, the stocker 7 provides a fail-safe mechanism to the fabrication facility, since even in the event of the stocker failure, the operation of the fabrication facility is not affected. By using the emergency access, the stocker 7 even when inoperative, can provide articles for the general work flow of the facility when the stocker 7 itself is undergoing repair.

In an embodiment, the present invention discloses a storage system employing a buffer station 3. The articles stored in the buffer station 3 are preferably stored in transfer format such as carrier boxes, to allow transporting the articles to the needed equipment.

The storage system, such as workpiece or reticle stocker, generally comprises a storage chamber 11 with an IO station 1 section, communicated by a robotic handling system 4. The storage chamber 11 is preferably cleaner than the outside environment, and therefore the storage system preferably comprises a load lock 5 linking the storage chamber 11 to the IO station 1. The storage chamber 11 can store the articles in their bare form (e.g. only the article is stored), in their transfer form (e.g. inside carrier boxes), or in their storage form. The storage form is typically between bare and transfer forms, providing better coverage and protection than the bare form, but not as much as the transfer form.

The storage form also can provide emergency protection to the articles in the storage chamber 11, in the event of the environmental breach. In the failure of e.g. clean air flow, the articles stored in bare form in the storage chamber 11 can be all contaminated. The storage form can prevent the contamination. The storage form can be much simpler than the transfer form, since the storage form is not designed for transportation. Thus storage in storage form is much more cost effective than storage in transfer form.

In a typical storing operation, the articles in their transfer form, e.g. a carrier box, are loaded into IC station 1. The robotic handler 4, also referred to as the IC robotic handler, retrieves the carrier boxes, and brings the carrier boxes to the load lock 5 for contamination-free transfer to the storage chamber 11. A clean robotic handler, preferably a second robotic handler operating in a cleaner environment, picks up the carrier box, or picks up the article, leaving behind the carrier box, and transfers it to the storage chamber 11. A storage box assembly might be located between the load lock 5 and the storage chamber 11 for the assembly of the storage box to the articles, if needed.

For the retrieving operation, the articles are retrieved from the storage chamber 11 by the cleaner robotic handler, passing through the storage box assembly, if needed, then transferred to the load lock area to be pick up by the IO robotic handler 4. The IO robotic handler 4 can assemble a carrier box to the articles if the articles are in their bare form. The immediately needed articles are stored in the IO station 1 to be transferred. The to-be-needed articles are stored in the buffer station 3. The robotic handler 4 can also transfer the immediately needed articles from the buffer station to the IO station 1, since the buffer station 3 stores the articles to be needed in the immediate future. The IO station 1 can be the operator loader, or the OHT loader.

The storage system can communicate with the fabrication facility to know what articles are needed, immediately and in the near future. Thus the storage system can retrieve the articles from the storage chamber 11 and store the articles in the buffer station 3 and the IO station 1. The communication equipment can be a controller or a computer system, managing the information retrieval and sequencer for the workpiece flow of a facility. The algorithm can determine the workpieces to be stored in the buffer stations, waiting to be accessed.

The buffer station 3, with its emergency access, allows the storage system to contribute to the work flow, even in a failure event. Further, with the transfer from the buffer station 3 to the IO station 1, the storage system can have a higher throughput, since the transfer to the IO station 1 is from the buffer station 3, not from the inner storage chamber 11.

The storage system can be a reticle stocker, storing reticles in either bare form, storage form or transfer form. The storage chamber 11 is preferably a high density storage chamber to reduce equipment footprint. An optional storage form assembly can be included between the storage chamber 11 and the load lock area for changing the article form.

In another embodiment, the present invention discloses a methodology for failsafe equipment, especially for a storage system. The method comprises a determination of the articles needed in a predetermined period in the immediate future, and then retrieving these articles and storing them in a buffer station 3. The buffer station 3 has an emergency access to allow the retrieval of the articles in the event of equipment failure. In normal operation, the IC station 1 can retrieve articles from the buffer station 3.

In an embodiment, a method of stocking reticles in a manufacturing process involves a reticle stocker and reticle buffer station 3. The method includes conducting a status check to determine the reticles to be needed within a certain amount of time, and then preparing to have the reticles to be transported to the buffer station 3 from a reticle stocker storage system.

In another aspect, the present invention discloses a management methodology and apparatuses to a fabrication equipment to reduce the waiting time, especially for operators. The present invention discloses an IC buffer station for minimizing waiting time, especially for operator.

Different process tools have different tool throughput with high throughput tools requiring s high number of IO stations. For example, for a deposition tool with 50 wafers per hour throughput, only 2 IO stations are needed per hour for 2 wafer carriers with 25 wafers per carrier. For a metrology tool which only measures one wafer per carrier with 50 wafers per hour throughput, 50 IO stations are needed per hour.

To accommodate this requirement of high throughput and metrology tools, an IO buffer station adjacent the IO station 1 is included, so that wafer carriers may be stored locally and adjacent the IO station 1. Such IO buffer stations are generally configured adjacent the tool IO station 1, and includes shelves for storing wafer carriers with a transport system for transferring the wafers carriers to and from the IO buffer station.

The IO buffer station is similar to the buffer station 3, except without the emergency access, since the IO buffer station only transfers to and from IO station 1. The IO buffer station can be small, since it does not need the ergonometry nor the comfort for the operation handling or automatic OHT handling.

The buffer system is used with single reticle carrier boxes. Single reticle carrier boxes only contain one reticle within each box, and therefore the transferring of a number of reticles would take a long time. Thus the number of IO stations is desired to be as large as possible to handle throughput issue. A typical number is between 10 to 20. However, even with this number, it might not be enough. IO stations take up space, since it is designed for human or automatic OHT interaction, and therefore it has to be ergonomic to prevent repetitive stress induced damage. Thus increasing the number of IO stations is not desired.

The IO buffer station of the present invention serves the need. The IO buffer station is not designed for human interaction, therefore the space can be much smaller than an IO station 1. A balanced number of IO stations and IO buffer stations thus can be optimum for space constraint and throughput constraint. The addition of IO buffer stations would ease the burden on the space requirement for IO stations. A number of IO stations together with a number of IO buffer stations would optimize the facility requirements and the floor space requirements. Buffer stations also can double as IO buffer stations.

In another aspect, the present invention discloses a 2-D array of buffer stations 3 (or IO buffer stations) with XY linear guide robotic for accessing operation. The array can also include a 2-D array of operator IO stations 1, or 1-D line of 10 IO stations at the top for OHT transport. The 2-D array can form the front face of the tool.

FIG. 1 shows a schematic of a front view of a stocker 7 according to one embodiment of the present invention. The stocker 7 comprises an array of 3×4 IO stations 1 with individual compartments and door access. The IO stations 1 are designed for operator access, thus located at a reasonable height. The stocker 7 also comprises a linear array of 4 IO stations 2 for OHT transport, located on top of the stocker 7.

The stocker 7 comprises an array of 6×7 buffer stations for, among other things, emergency access. The buffer stations are not subjected to operator requirements, thus can be located essentially anywhere. A 2-D linear guide robotic system 4 provides access to the IO stations 1 and the buffer stations 3. Also shown is the load lock system 5, to transfer the articles between the IO stations/buffer stations and the storage chamber. There are other components, such as air flow 6, emergency stop, etc.

Figure 2:
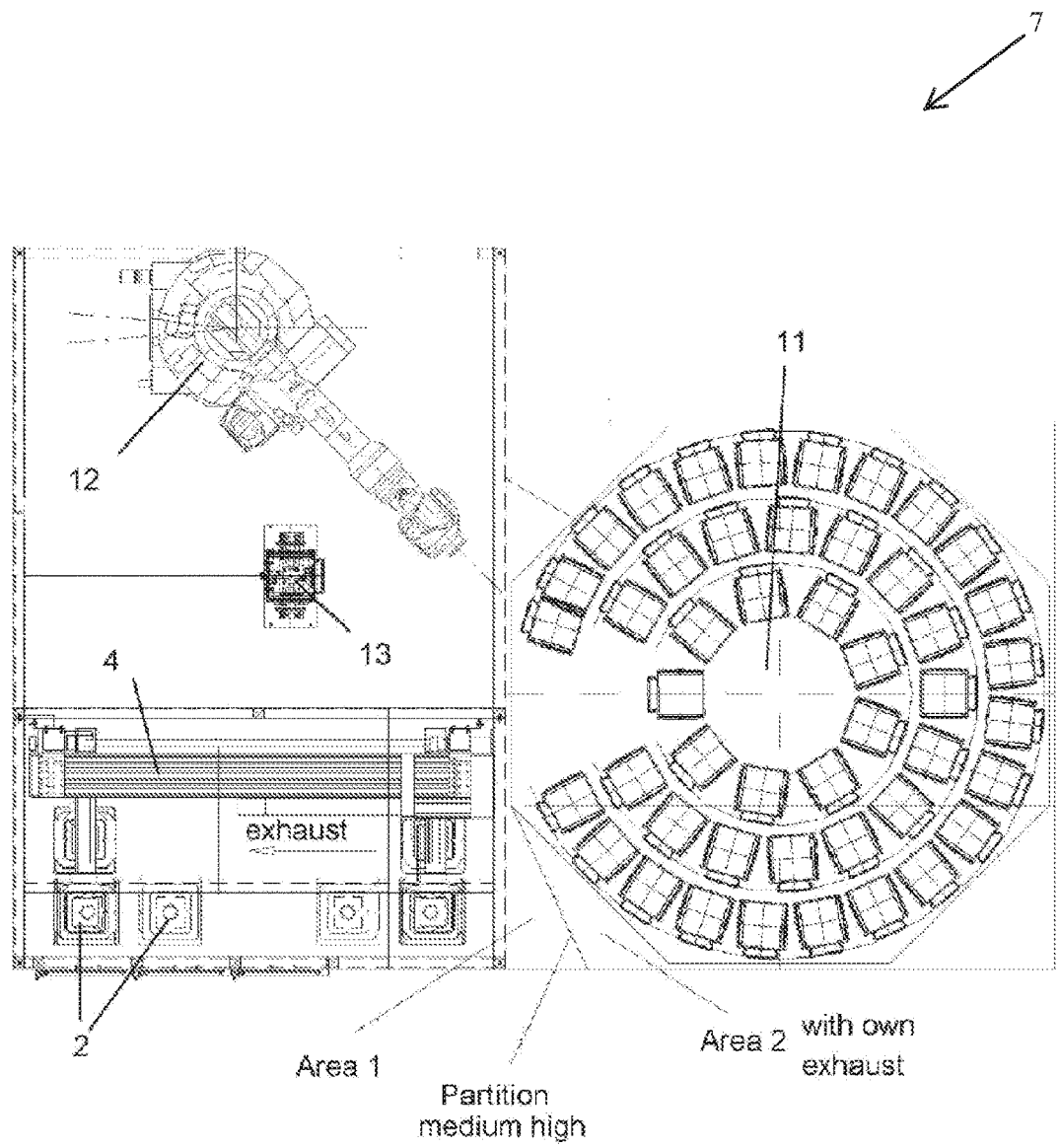
FIG. 2 shows a top view of an embodiment of a reticle stocker, utilizing buffer stations.

FIG. 2 shows a schematic of a top view of a stocker 7 according to one embodiment of the present invention. The stocker 7 comprises a storage chamber 11 with 3 concentric ring storage areas, with a robotic 12 access. There is a storage box assembly system 13, for assembling and disassembling a bare article with a storage box, when coming to or leaving the storage chamber 11. Also shown are the 4 IO stations 2 for OHT transport, together with a 2-D linear guide 4 for robotic handling of IO stations 1 and buffer stations 3.

The stocker 7 can temporarily store the workpieces before and after the individual process steps. Also, the stocker 7 can store supply and raw material for a new production load, for filling up partly filled loads, or for test workpieces for testing a production process. The wafers can be stored bare or in containers, such as cassettes or pods, each of which can hold up to 25 wafers. The reticles also can be stored bare or in single storage container, each typically contains one reticle. The cassettes or the reticles can be stored in carriers for moving throughout the facility. Also, the stocker storage chamber can store the workpieces in their storage boxes which is specially designed for storage. The stockers also must be kept as clean as possible, using filter, and clean air supply. The stocker comprises shelves or racks for supporting carrier boxes, each carrier box containing objects to be processed. The stocker comprises a robot for mounting the carrier boxes to or from the shelves. The stocker comprises a plurality of box-like compartments on the racks or shelves, each box-like compartment for receiving the carrier box. The carrier box contains semiconductor wafers, liquid crystal display (LCD) substrates, or similar objects. The stockers are positioned in a fabrication facility, preferably arranged between a transporting system for connecting process equipments. Each stocker has input/output (IO) stations where the carrier boxes are brought into, and out of, the stocker. The carrier boxes being transported to or from the stocker can be handled by an operator, by a connecting transport system. Workpieces in semiconductor fabrication facility such as reticles, masks, wafer, LCD, are usually stored, handled and transported in extremely clean environments, because small particles can have great impact of process yield.

To decrease particle contamination and to enhance thereby production throughput, the stocker can be designed with improved and clean enclosures instead of storing the workpieces in carrier boxes.

A conventional semiconductor fabrication facility typically includes multiple fabrication areas interconnected by a path, designed for human operators or an overhead transfer system (OHT). As an alternative to the operator delivery system, there exists an overhead transport system including a monorail cable hoist. Such overhead transport systems are capable of transporting a carrier horizontally along the length of the tool bay, and picking and dropping a carrier to an IC station. The overhead transport systems must include a clear, unobstructed path, with precision and accuracy.

The facility also includes a wafer stocker storage system, spreading throughout the fabrication facility. The facility further includes a reticle storage system, handling storage, retrieval and sorting of reticles, with or without transfer boxes or carrier boxes. A stocker comprises typically a large storage chamber having a plurality of shelves on which the bare workpieces or the workpieces in storage boxes may be stored. The stocker further comprises a transport system for transferring the workpieces or the workpieces in storage boxes into and out of the stocker, and also for moving within the stocker.

The buffer station can include a plurality of shelves, each shelf having an upper surface capable of supporting a carrier box. Shelves are designed to have minimum space, thus may be vertically spaced from each other a distance sufficient to support a carrier box, and to allow a robot to enter to transport the carrier box. In one embodiment, the shelves are aligned in a plurality of rows and columns. However the shelves may be provided in various configurations. With the presence of the IC buffer station at the stocker, the number of IC stations might be decreased, allowing a reduction in tool footprint.

In one aspect, a robot is provided with ability to move in an X-Y cartesian plane, to access a plurality of shelves for either the buffer station or IO station.

The present invention may also be embodied in a machine or computer readable format, e.g., an appropriately programmed computer, a software program written in any of a variety of programming languages. The software program would be written to carry out various functional operations of the present invention, Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g. a processor.

Figure 3:
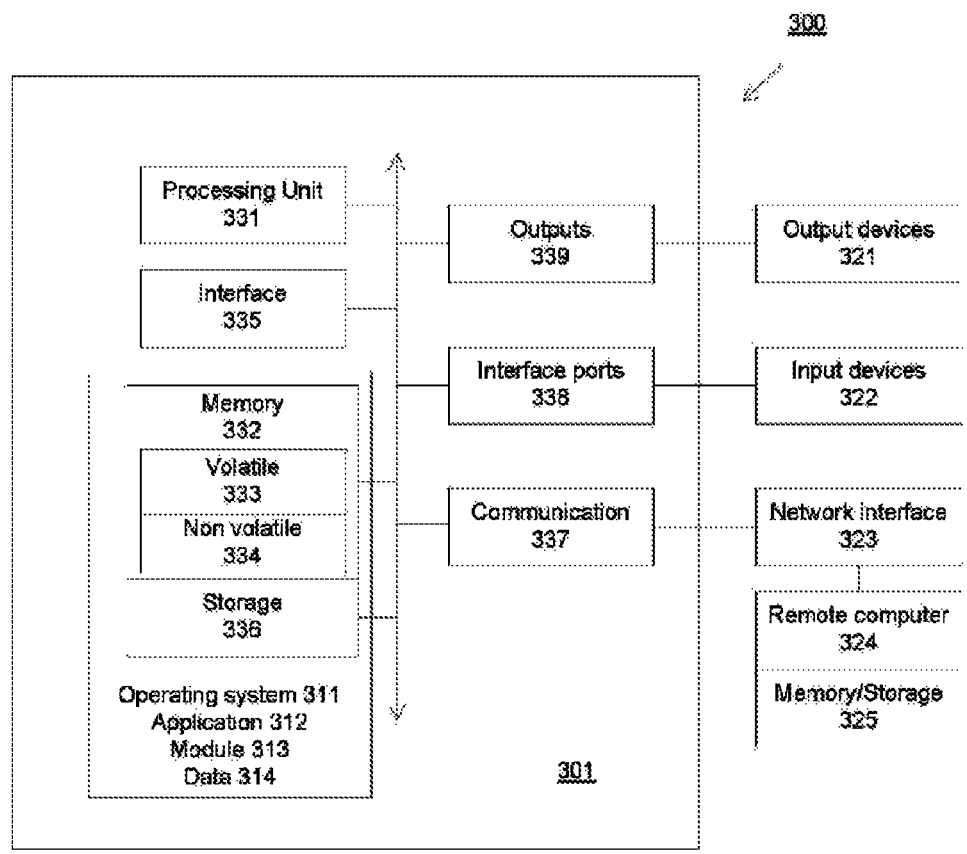
FIG. 3 shows an exemplary computer system for the present invention.

With reference to FIG. 3, an exemplary environment 300 for implementing various aspects of the invention includes a computer 301, comprising a processing unit 331, a system memory 332, and a system bus 330. The processing unit 331 can be any of various available processors, such as single microprocessor, dual microprocessors or other multiprocessor architectures. The system bus 330 can be any type of bus structures or architectures, such as 12-bit bus, Industrial Standard Architecture (ISA), MicroChannel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), or Small Computer Systems Interface (SCST).

The system memory 332 can include volatile memory 333 and nonvolatile memory 334. Nonvolatile memory 334 can include read only memory (ROM), programmable ROM (PROM), electrically programmable ROM (EPROM), electrically erasable ROM (EEPROM), or flash memory. Volatile memory 333, can include random access memory (RAM), synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), or direct Rambus RAM (DRRAM).

Computer 301 also includes storage media 336, such as removable/non-removable, volatile/nonvolatile disk storage, magnetic disk drive, floppy disk drive, tape drive, Jaz drive, Zip drive, LS-100 drive, flash memory card, memory stick, optical disk drive such as a compact disk ROM device (CD-ROM), CD recordable drive (CD-R Drive), CD rewritable drive (CD-RW Drive) or a digital versatile disk ROM drive (DVD-ROM). A removable or non-removable interface 335 can be used to facilitate connection.

The computer system 301 further can include software to operate in environment 300, such as an operating system 311, system applications 312, program modules 313 and program data 314, which are stored either in system memory 332 or on disk storage 336. Various operating systems or combinations of operating systems can be used.

Input devices 322 can be used to enter commands or data, and can include a pointing device such as a mouse, trackball, stylus, touch pad, keyboard, microphone, joystick, game pad, satellite dish, scanner, TV tuner card, sound card, digital camera, digital video camera, web camera, and the like, connected through interface ports 338. Interface ports 338 can include a serial port, a parallel port, a game port, a universal serial bus (USB), and a 1394 bus. The interface ports 338 can also accommodate output devices 321. For example, a USB port may be used to provide input to computer 301 and to output information from computer 301 to an output device 321. Output adapter 339, such as video or sound cards, is provided to connect to some output devices such as monitors, speakers, and printers.

Computer 301 can operate in a networked environment with remote computers 324. The remote computers 324, shown with a memory storage device 325, can be a personal computer, a server, a router, a network PC, a workstation, a microprocessor based appliance, a peer device or other common network node and the like, and typically includes many or all of the elements described relative to computer 301. Remote computers 324 can be connected to computer 301 through a network interface 323 and communication connection 337. Network interface 323 can be communication networks such as local-area networks (LAN) and wide area networks (WAN). LAN technologies include Fiber Distributed Data Interface (FDDI), Copper Distributed Data Interface (CDDI), Ethernet/IEEE 1202.3, Token Ring/IEEE 1202.5 and the like. WAN technologies include, but are not limited to, point-to-point links, circuit switching networks like Integrated Services Digital Networks (ISDN) and variations thereon, packet switching networks, and Digital Subscriber Lines (DSL).

Figure 4:
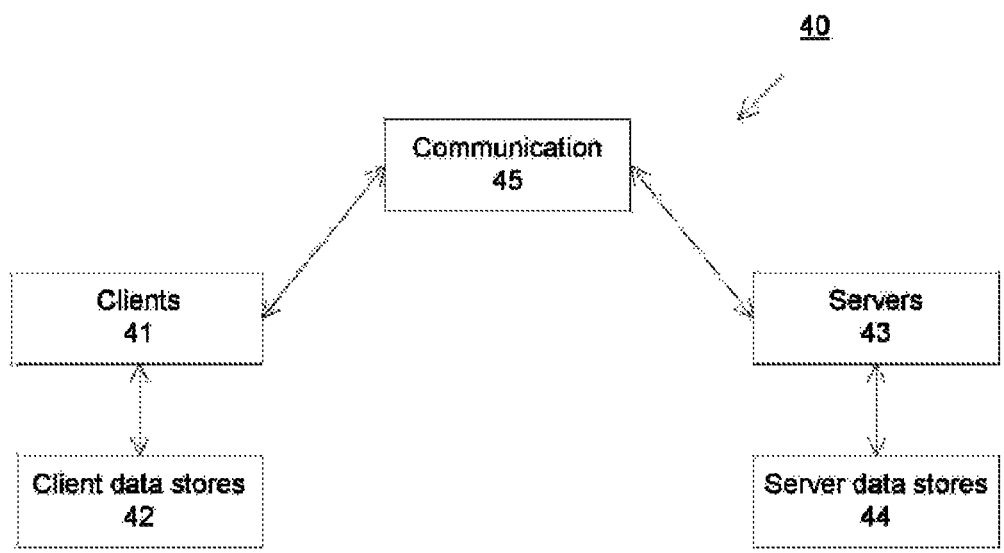
FIG. 4 shows an exemplary computer environment for the present invention.

FIG. 4 is a schematic block diagram of a sample computing environment 40 with which the present invention can interact. The system 40 includes a plurality of client systems 41. The system 40 also includes a plurality of servers 43. The servers 43 can be used to employ the present invention. The system 40 includes a communication network 45 to facilitate communications between the client systems 41 and the servers 43. Client data storage 42, connected to client system 41, can store information locally. Similarly, the server 43 can include server data storages 44.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

What is claimed is:

1. A method for providing continuous operation in a facility, the method comprising:
storing a plurality of workpieces in a buffer station, wherein the buffer station is separate from a storage chamber that is communicably coupled to the buffer station, the storage chamber having a clean environment, wherein the buffer station includes a common housing having a bypass access and an IO station access, the bypass access being separate and distinct from the IO station access, and
accessing the plurality of workpieces, through the bypass access, where the bypass access provides an alternate egress pathway from the common housing, the alternate egress pathway being alternate to a different egress pathway from the common housing provided by the IO station access, so that the plurality of workpieces are accessed through the bypass access without exposing the plurality of workpieces in the clean environment of the storage chamber to an outside environment within the facility.

2. The method of claim 1, further comprising determining another plurality of workpieces to be processed in a next predetermined period.

3. The method of claim 2, wherein the next predetermined period is an average time to repair the equipment.

4. The method of claim 2, wherein the next predetermined period is 24 hours.

5. The method of claim 1, wherein the accessing is performed by an operator outside a stocker in the facility.

6. The method of claim 1, wherein the buffer station is an IO station.

7. The method of claim 1, wherein the plurality of workpieces are stored in a plurality of containers.

8. A method for providing continuous operation in a facility, the method comprising:
retrieving a plurality of workpieces that are queued to be processed;
storing the retrieved plurality of workpieces in a buffer station, wherein the buffer station is separate from a storage chamber that is communicably coupled to the buffer station, the storage chamber having a clean environment for holding the plurality of workpieces, wherein the buffer station includes a common housing having an external bypass access and an IO station access, the external bypass access being separate and distinct from the IO station access, and
accessing, through the external bypass access, where the external bypass access provides an alternate egress pathway from the common housing, the alternate egress pathway being alternate to a different egress pathway from the common housing provided by the IO station access, the plurality of workpieces, so that the plurality of workpieces are accessed through the external bypass access without exposing the plurality of workpieces in the clean environment of the storage chamber to an outside environment within the facility.

9. The method of claim 8, further comprising moving the plurality of workpieces from the buffer station to a separate IO station.

10. The method of claim 9, wherein the separate IO station comprises the IO station access to transfer the plurality of workpieces outside a stocker in the facility.

11. The method of claim 8 further comprising determining another plurality of workpieces to be processed in a next predetermined period.

12. The method of claim 11, wherein the next predetermined period is 24 hours.

13. The method of claim 11, wherein the next predetermined period is an average time to repair the equipment.

14. The method of claim 11, wherein determining another plurality of workpieces is based on a workpiece flow operation.

15. The method of claim 8, wherein the buffer station comprises a normal access for accessing the workpieces during normal operation of a stocker of the facility.

16. A non-transitory, machine readable medium comprising machine executable program instructions which, when executed by a data processing system, cause the data processing system to perform a method for improving continuous operation of a facility, the method comprising:
  determining a plurality of workpieces to be removed from a stocker, including a storage chamber having a clean environment, for a next predetermined period, wherein the determined plurality of workpieces are stored in a buffer station that is communicably coupled to the storage chamber, wherein the buffer station includes a common housing having a bypass access and an IO station access, the bypass access being separate from the IO station access, and
  accessing the plurality of workpieces, through the bypass access, where the bypass access provides an alternate egress pathway from the common housing, the alternate egress pathway being alternate to a different egress pathway from the common housing provided by the IO station access so that the plurality of workpieces are accessed through the bypass access and permitting removal of the plurality of workpieces in the buffer station without exposing the plurality of workpieces in the clean environment of the storage chamber to an outside environment within the facility.

17. The non-transitory medium of claim 16, wherein the buffer station comprises a normal access for accessing the workpieces during normal operation of a stocker of the facility.

18. The non-transitory medium of claim 16, wherein the next predetermined period is an average time to repair the equipment.

19. The non-transitory medium of claim 16, wherein the next predetermined period is 24 hours.

20. The non-transitory medium of claim 16, wherein the facility comprises at least one of a wafer stocker, a flat panel display stocker, and a reticle stocker.

* * * * *